United States Patent
Peng et al.

(10) Patent No.: US 10,867,917 B1
(45) Date of Patent: Dec. 15, 2020

(54) SEMICONDUCTOR DEVICE, ASSOCIATED METHOD AND LAYOUT

(71) Applicant: TAIWAN SEMICONDUCTOR MANUFACTURING COMPANY LTD., Hsinchu (TW)

(72) Inventors: Shih-Wei Peng, Hsinchu (TW); Hui-Ting Yang, Hsinchu County (TW); Wei-Cheng Lin, Taichung (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/442,251

(22) Filed: Jun. 14, 2019

(51) Int. Cl.
*H01L 23/528* (2006.01)
*H01L 21/768* (2006.01)
*H01L 23/522* (2006.01)

(52) U.S. Cl.
CPC .... *H01L 23/5283* (2013.01); *H01L 21/76816* (2013.01); *H01L 23/5221* (2013.01); *H01L 23/5226* (2013.01)

(58) Field of Classification Search
CPC   H01L 23/528; H01L 23/5283; H01L 23/5221
See application file for complete search history.

(56) References Cited

U.S. PATENT DOCUMENTS

| | | | | |
|---|---|---|---|---|
| 7,667,271 B2 * | 2/2010 | Yu | ............ | H01L 29/785 257/347 |
| 7,667,328 B2 * | 2/2010 | Stamper | ............ | H01L 23/5286 257/767 |
| 7,910,453 B2 * | 3/2011 | Xu | ............ | H01L 29/4234 438/424 |
| 7,911,063 B2 * | 3/2011 | Terazono | ............ | H01L 24/05 257/776 |
| 8,779,592 B2 * | 7/2014 | Tang | ............ | H01L 23/522 257/758 |
| 10,410,965 B2 * | 9/2019 | Wee | ............ | H01L 29/785 |
| 10,622,306 B2 * | 4/2020 | Liaw | ............ | H01L 27/0924 |
| 10,756,114 B2 * | 8/2020 | Liaw | ............ | H01L 23/5283 |
| 2017/0179112 A1 * | 6/2017 | Narita | ............ | H01L 27/0277 |
| 2020/0105660 A1 * | 4/2020 | Sio | ............ | H01L 21/823475 |

* cited by examiner

*Primary Examiner* — David A Zarneke
(74) *Attorney, Agent, or Firm* — WPAT, P.C., Intellectual Property Attorneys; Anthony King

(57) ABSTRACT

A semiconductor device includes gate strips, first metal strips and second metal strips. The first metal strips are formed above the gate strips. The first metal strips are co-planar, and each first metal strip and one of the gate strips are crisscrossed. The second metal strips are formed above the first metal strips. The second metal strips are co-planar, and each second metal strip and one of the first metal strips are crisscrossed. One first metal strip connects to one gate strip crossing underneath by a first contact via without connecting to one second metal strip crossing over. A length between two adjacent gate strips is twice as a length between two adjacent second metal strips, and a length of said one first metal strips is smaller than two and a half times as the length between two adjacent gate strips.

20 Claims, 17 Drawing Sheets

US 10,867,917 B1

SEMICONDUCTOR DEVICE, ASSOCIATED METHOD AND LAYOUT

BACKGROUND

Due to complex process rules, the lack of routing resource is a challenge for the design of integrated circuit (IC), especially in the advance process. In order to own good pin access ability for achieving smaller chip area and better performance, a novel design is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
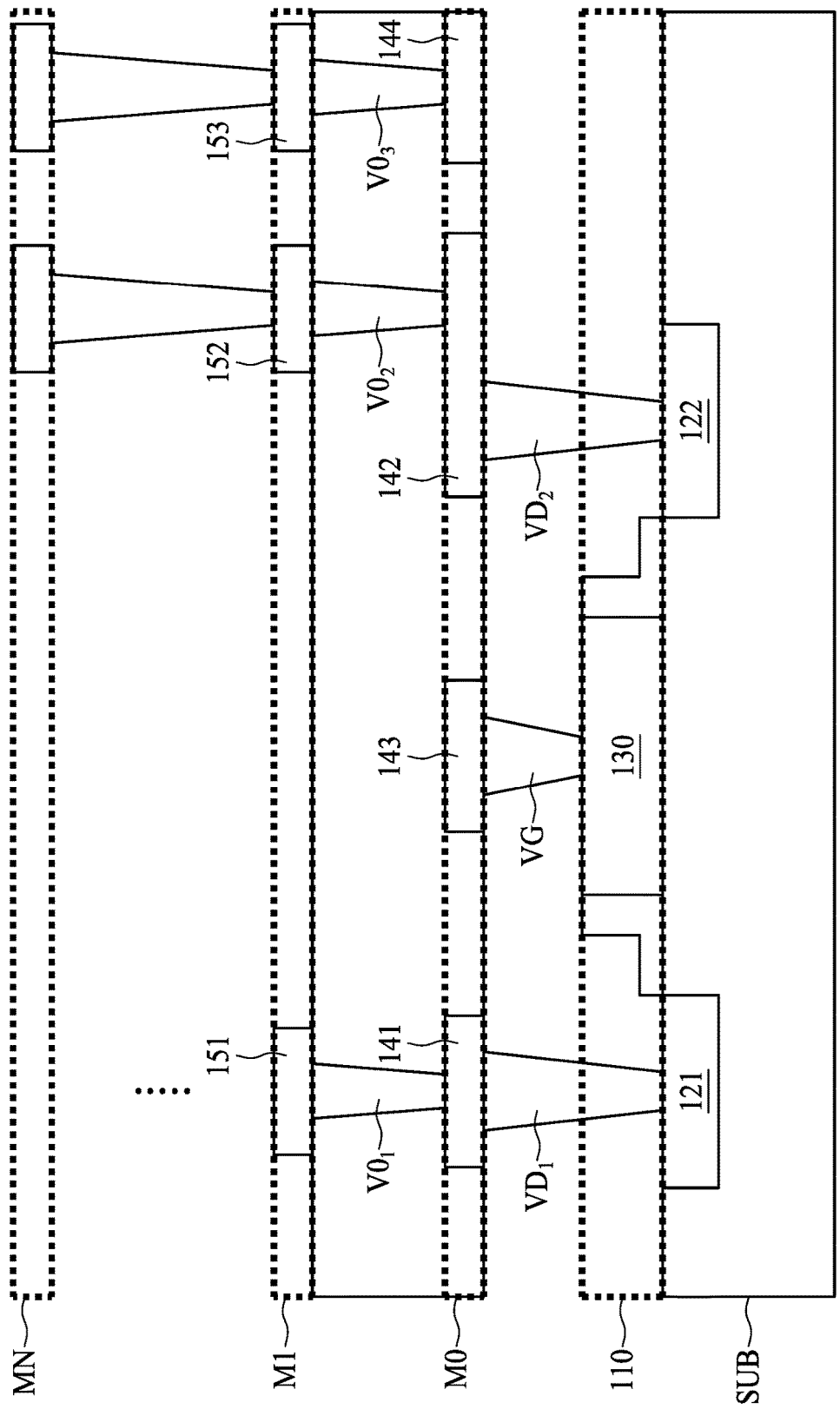
FIG. 1 is a diagram illustrating a cross-sectional perspective of a part of a semiconductor device in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a cross-sectional perspective of a part of a semiconductor device 10 in accordance with an embodiment of the present disclosure. The semiconductor device 10 includes a substrate SUB, a gate layer 110 and a plurality of metal layers M0, M1, . . . , MN. The substrate SUB includes two doping regions 121 and 122, wherein the doping region 121 and 122 are configured to be respective a source region and a drain region of a transistor. The gate layer 110 includes a plurality of gate strips such as the gate strip 130 shown in FIG. 1 Each gate strip is configured to be a gate terminal of the transistor. In some embodiments, each gate strip is made of conductive material such as copper, aluminum, tungsten, or the alloy of the aforementioned materials. In some embodiments, each gate strip is made of polysilicon. It should be noted that the material of each gate strip is not limited by the present disclosure.

The metal layers M0, M1, . . . , MN constitute an interconnection metal layer of the semiconductor device 10. The metal layer M0 is the bottom layer in the interconnection metal layer, then the metal layer M1, and so on. The metal layer M0 includes a plurality of metal strips such as the strips 141, 142, 143 and 144 shown in FIG. 1. The strips 141 and 142 connect to the source/drain regions 121 and 122, respectively, via contact vias $VD_1$ and $VD_2$. The strips 143 connects to the gate strip 130 via a contact via VG. The plurality of metal strips such as the strips 141, 142, 143 and 144 in the metal layer M0 are co-planar. It should be noted that the metal strips in the metal layer M0 are not limited to connect to the source/drain region or the gate terminal. For example, the strip 144 is configured to receive a reference voltage, and not connected to either the source/drain region or the gate terminal. In other words, the connections between the metal layer M0 and the source/drain region and the gate layer 110 depends on the practical design.

The metal layer M1 is disposed above the metal layer M0. The metal layer M1 includes a plurality of metal strips such as the strips 151, 152 and 153 as shown in FIG. 1. In some embodiments, the strips in the metal layer M1 are connected to the strips in the metal M0 via contact vias. For example, the strips 151, 152 and 153 are connected to the strips 141, 142 and 144 via the contact vias $V0_1$, $V0_2$ and $V0_3$, respectively. The strips in the metal layer M1 are co-planar. As mentioned above, the connections between the strips in the metal layer M0 and the strips in the metal layer M1 depends on the practical design.

Figure 2:
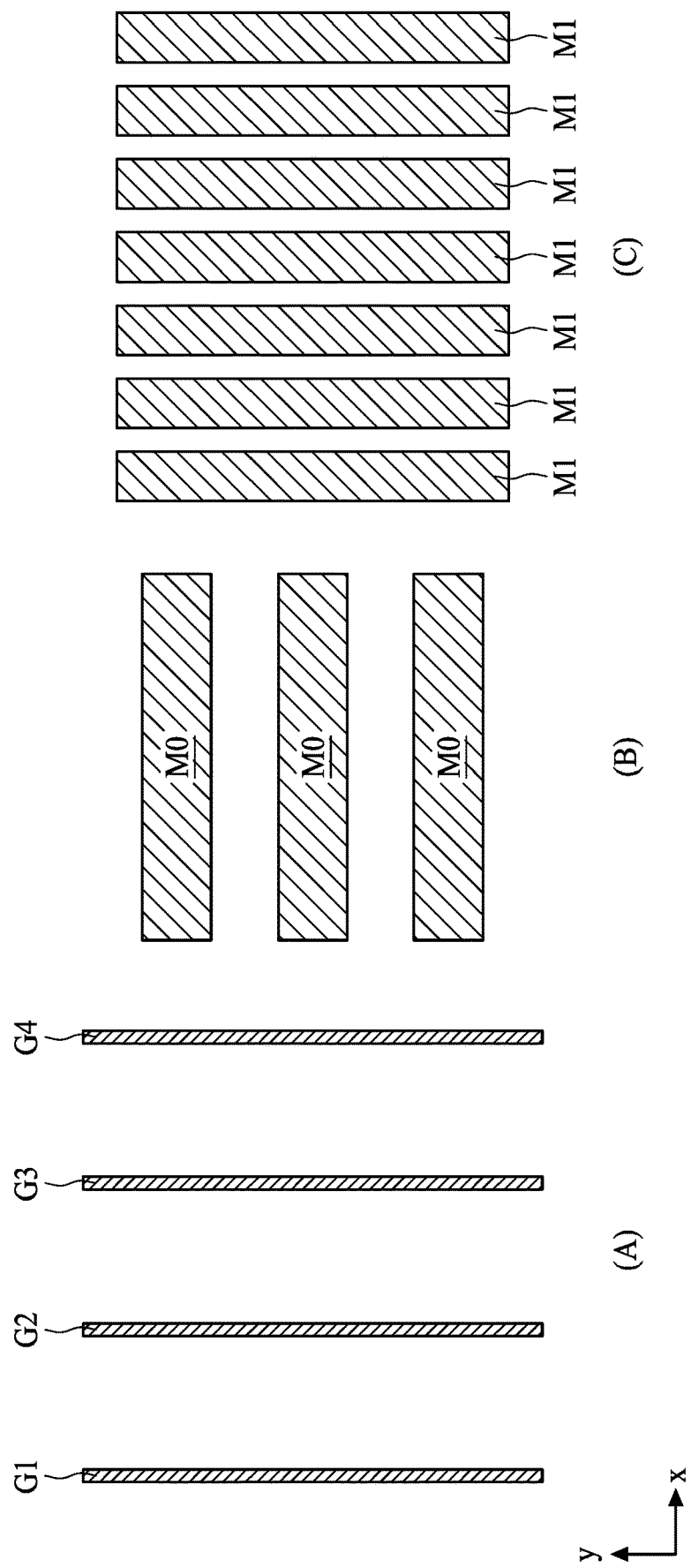
FIG. 2 is a diagram illustrating a top view of gate strips, metal strips in the metal layers M0 and M1 in a semiconductor device in accordance with an embodiment of the present disclosure.

FIG. 2 is a diagram illustrating a top view of gate strips, metal strips in the metal layers M0 and M1 in the semiconductor device 10 in accordance with an embodiment of the present disclosure. As shown in the sub-diagram (A) of FIG. 2, the gate strips G1, G2, G3 and G4 extend in a first direction, for example, y-direction from a top view. As shown in the sub-diagram (B) of FIG. 2, the strips in the metal layer M0 extend in a second direction, for example, x-direction from a top view. In other words, the strips in the metal layer M0 and the gate strips are crisscrossed from a top view. As shown in the sub-diagram (C) of FIG. 2, the strips in the metal layer M1 extends in the first direction, for example, y-direction. In other words, the strips in the metal layer M1 and the strip in the metal M0 are crisscrossed from a top view. However, this is only for illustrative purpose, in other embodiments, the strips in the metal layer M0 extends in the first direction same as the gate strips G1, G2, G3 and G4.

Figure 3:
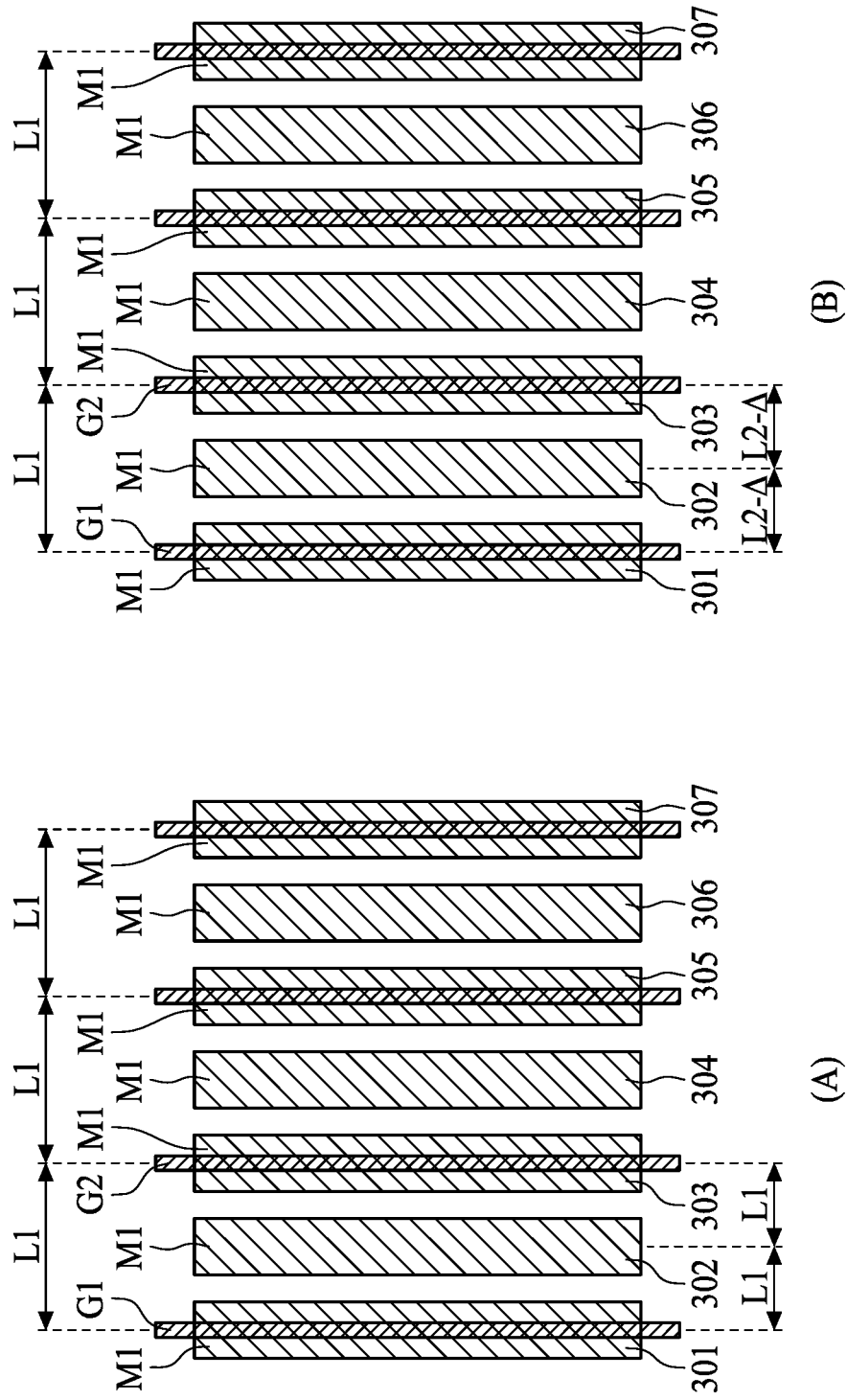
FIG. 3 is a diagram illustrating a top view of the gate strips and the strips in the metal layer M1 in semiconductor device in accordance with an embodiment of the present disclosure.

FIG. 3 is a diagram illustrating a top view of the gate strips and the strips in the metal layer M1 in the semiconductor device 10 in accordance with an embodiment of the present disclosure. As shown in the sub-diagram (A) of FIG. 3, a length L1 (or so-called a poly pitch) between two adjacent gate strips (e.g., the gate strips G1 and G2) is twice as a length L2 (or so-called a M1 pitch) between two adjacent strips (e.g., 301 and 302) in the metal layer M1. With such configurations, the circuit design becomes more flexible due to the ratio between the poly pitch and the M1 pitch is integer (i.e., 2:1). Accordingly, the pin access point configured to be an input terminal or an output terminal of a circuit can be increased, and the routing resource can be greatly released. In addition, due to the lack of routing resource is improved, the chip area can be reduced.

As mentioned in the embodiment of FIG. 2, the strips in the metal layer M0 can extend in the same direction as the gate strips. With such configurations, the length between two adjacent gate strips, e.g., the gate strips G1 and G2, is twice as a length (or so-called M0 pitch) between two adjacent strip in the metal layer M0.

It should be noted that, to facilitate the manufacturing process, the length between two adjacent gate strips, e.g., the gate strips G1 and G2, is not required to be exactly twice as the length between two adjacent strips in the metal layer M1. As shown in the sub-diagram (B) of FIG. 3, the length between the strips 301 and 302 in the metal layer M1 is L2−Δ while the length between the strips 302 and 303 in the metal layer M1 is L2+Δ.

The process of manufacturing the strips in the metal layer M1 can utilize double patterning technique, that is, two photolithography operations are performed upon the same layer. More specifically, a mask for the photolithography layer is fabricated first. Next, a first photolithography operation is executed on a dielectric layer with the fabricated mask, and a first patterned mask is generated. The first patterned mask includes a plurality of strip-shaped openings. The strip-shaped openings are prepared for the strips 301, 303, 305 and 307 shown in FIG. 3, that is, a length between two adjacent strip-shaped openings equals to the length between two adjacent gate strips. Next, a conductive material is filled into the strip-shaped openings to generate the strips 301, 303, 305 and 307 as shown in FIG. 3, and a transition patterned mask is generated. Next, a second photolithography operation is executed upon the transition patterned mask to generate a second patterned mask. The second patterned mask includes a plurality of strip-shaped openings. The plurality of strip-shaped openings are prepared for the strips 302, 304, and 306 shown in FIG. 3, that is, a length between two adjacent strip-shaped openings equals to the length between two adjacent gate strips. Next, a conductive material is filled into the strip-shaped openings to generate the strips 302, 304, and 306 shown in FIG. 3. Accordingly, the strips 301 to 307 in the metal layer M1 are generated.

It should be noted that for the upper metal layers (e.g., the metal layers M2 to MN) in the semiconductor device 10, masks for the following photolithography operations are fabricated. Those skilled in the art should readily understand the following photolithography operations for manufacturing the upper metal layers, the detailed description is omitted here for brevity.

Figure 4A:
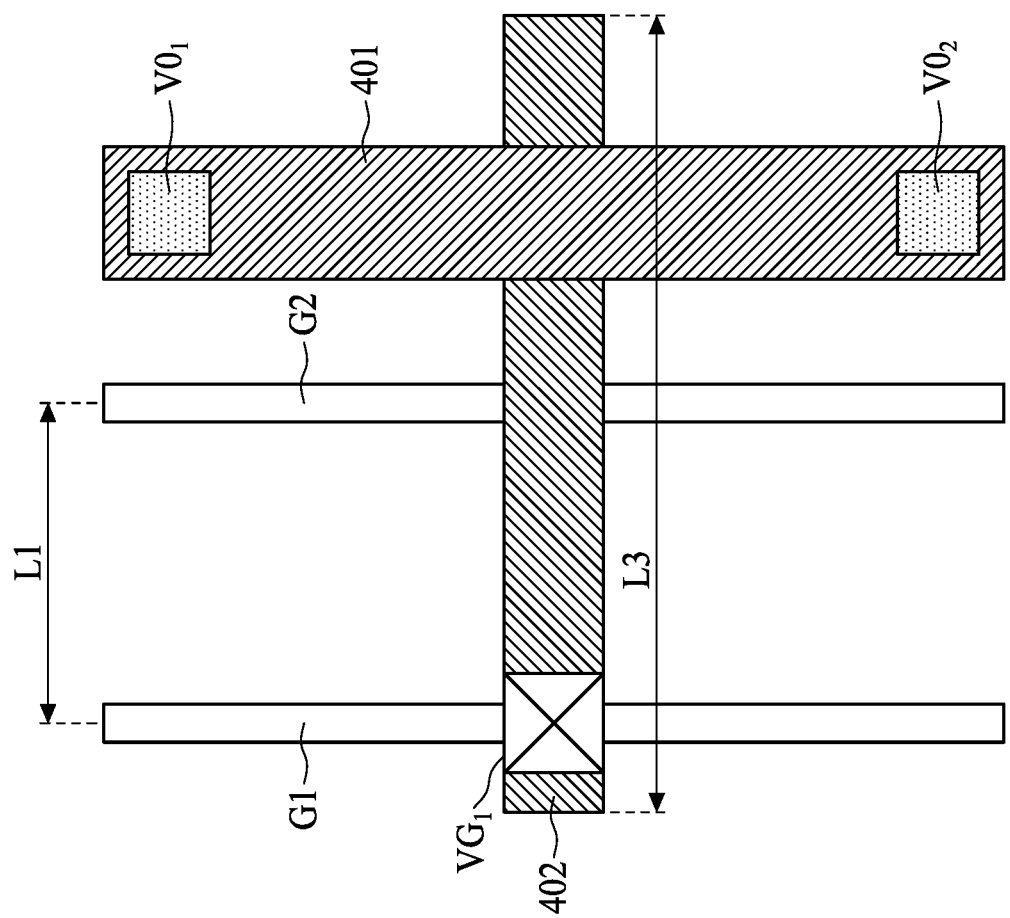
FIGS. 4A and 4B are diagrams illustrating a top view of the gate strips and a strip in the metal layer M0 in a semiconductor device in accordance with an embodiment of the present disclosure.
Figure 4B:
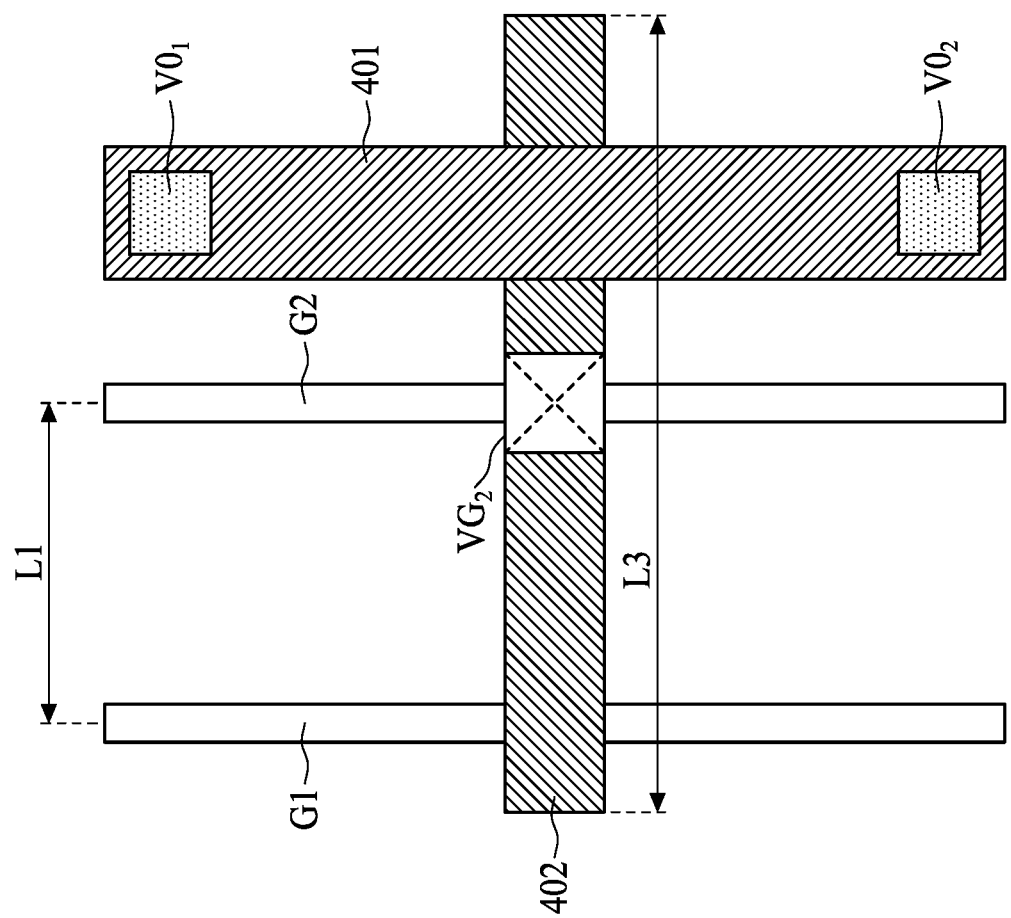

FIGS. 4A and 4B are diagrams illustrating a pattern of the gate strips, the strips in the metal layers M0 and M1 in the semiconductor device 10 in according with an embodiment of the present disclosure. In this embodiment, a strip 401 in the metal layer M1 crosses over a strip 402 in the metal layer M2. The strip 401 in the metal layer M1 connects to two other strips in the metal layer M0 by contact vias $V0_1$ and $V0_2$. The strip 402 in the metal layer M0 crosses over gate strips G1 and G2, and a length L3 of the strip 402 is smaller than two and a half times as the length L1 between two adjacent gate strips (e.g., G1 and G2). With such configurations, when the strip 402 is configured to receive an input signal or output an output signal of a standard cell, the strip 402 can be configured to be an access point without connecting to the upper metal layer (e.g., the strip 401 or any other strip in the metal layer M1 crossing over the strip 402). In other words, the strips 402 is configured to be a M0 pin. When the strips 402 is configured to be a M0 pin, it connects to a gate strip crossing underneath via a contact via. For example, as shown in FIG. 4A, the strip 402 connects to the gate strip G1 crossing underneath via a contact via $VG_1$. For another example, as shown in FIG. 4B, the strip 402 connects to the gate strip G2 crossing underneath via a contact via $VG_2$.

Figure 5A:
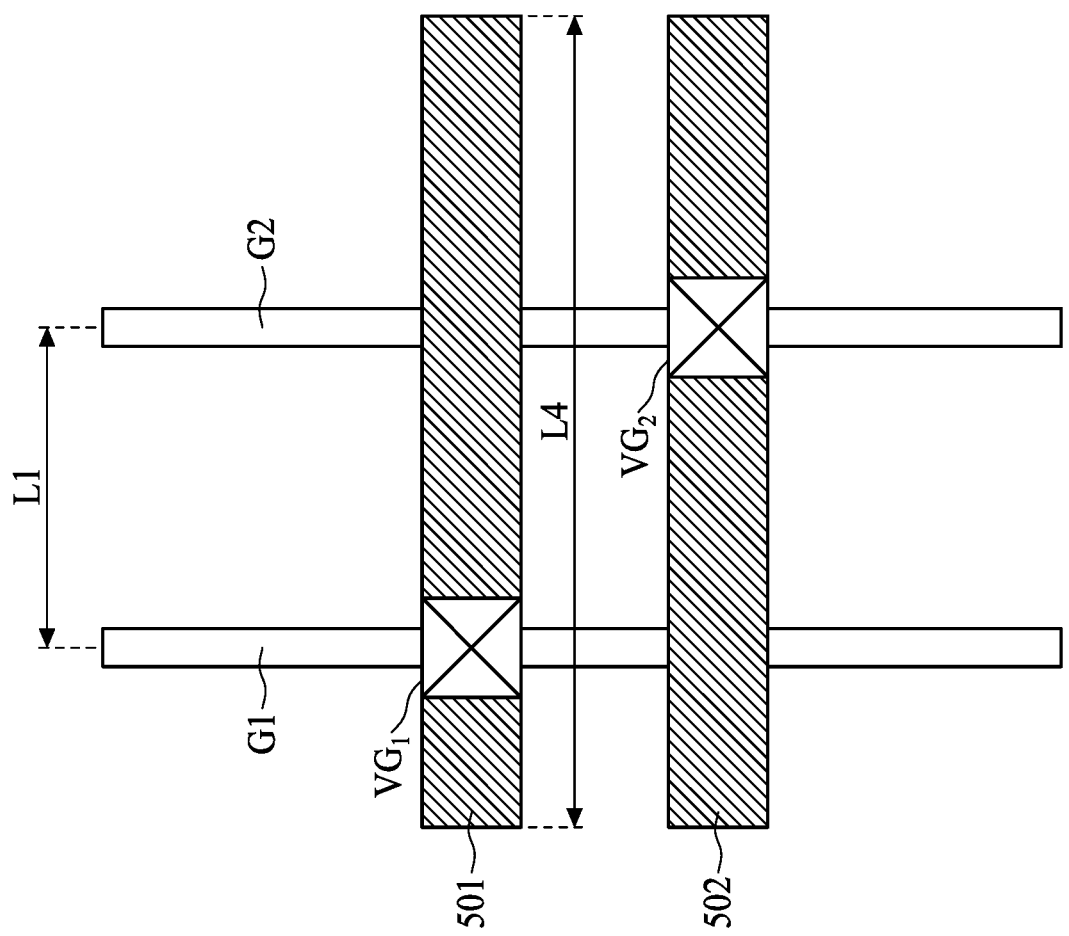
FIGS. 5A and 5B are diagrams illustrating a pattern of the gate strips, and the strips in the metal layer M0 in a semiconductor device in according with an embodiment of the present disclosure.
Figure 5B:
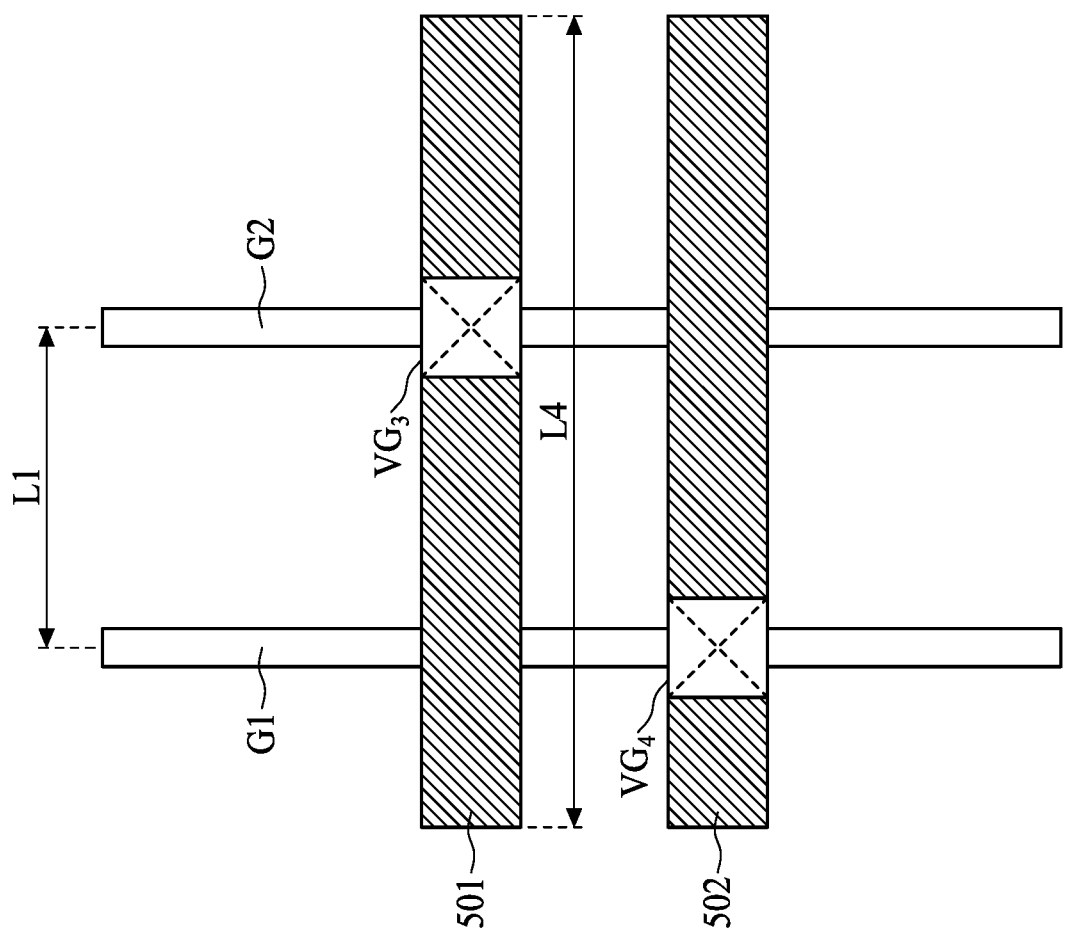

FIGS. 5A and 5B are diagrams illustrating a pattern of the gate strips, and the strips in the metal layer M0 in the semiconductor device 10 in according with an embodiment of the present disclosure. As shown in FIG. 5A, two adjacent strips 501 and 502 in the metal layer M0 are arranged in parallel, and the strips 501 and 502 cross over the gate strips G1 and G2. The strip 501 is as long as the strip 502, and the length L4 of the strips 501 and 502 is smaller than two and a half times as the length L1 between two adjacent gate strips (e.g., G1 and G2). With such configurations, when each of the strips 501 and 502 is configured to receive an input signal or output an output signal, each of the strips 501 and 502 can be configured to be an access point without connecting to the upper metal layer (e.g., any strip in the metal layer M1 crossing over). In other words, each of the strips 501 and 502 is configured to be a M0 pin. When each of the strips 501 and 502 is configured to be a M0 pin, it connects to a gate strip crossing underneath via a contact via. For example, as shown in FIG. 5A, the strip 501 connects to the gate strip G1 crossing underneath via a contact via $VG_1$ while the strip 502 connects to the gate strip G2 crossing underneath via a contact via $VG_2$. For another example, as shown in FIG. 5B, the strip 501 connects to the gate strip G2 crossing underneath via a contact via $VG_3$ while the strip 502 connects to the gate strip G1 crossing underneath via a contact via $VG_4$.

Figure 6A:
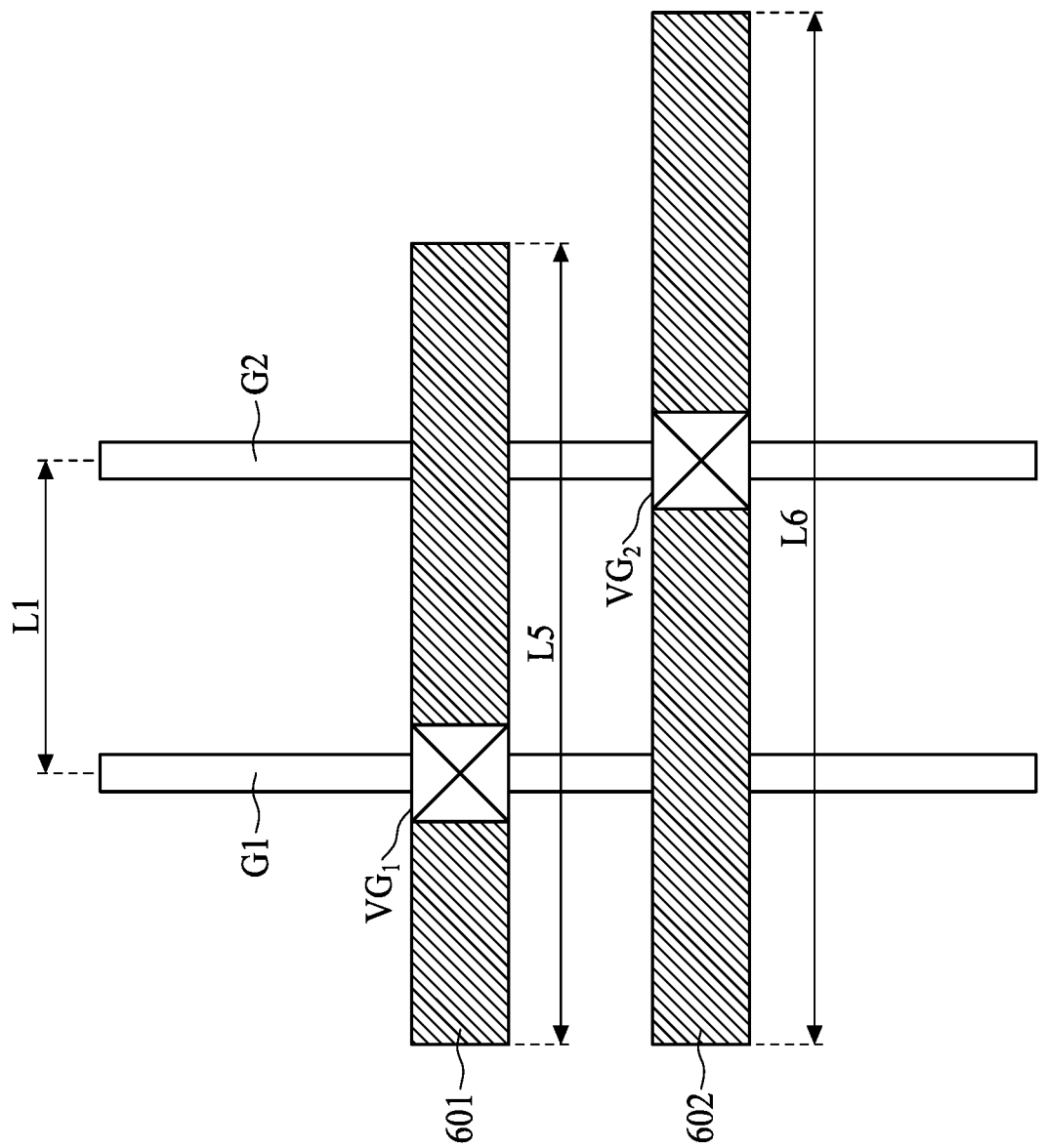
FIGS. 6A and 6B are diagrams illustrating a pattern of the gate strips, and the strips in the metal layer M0 in a semiconductor device in according with another embodiment of the present disclosure.
Figure 6B:
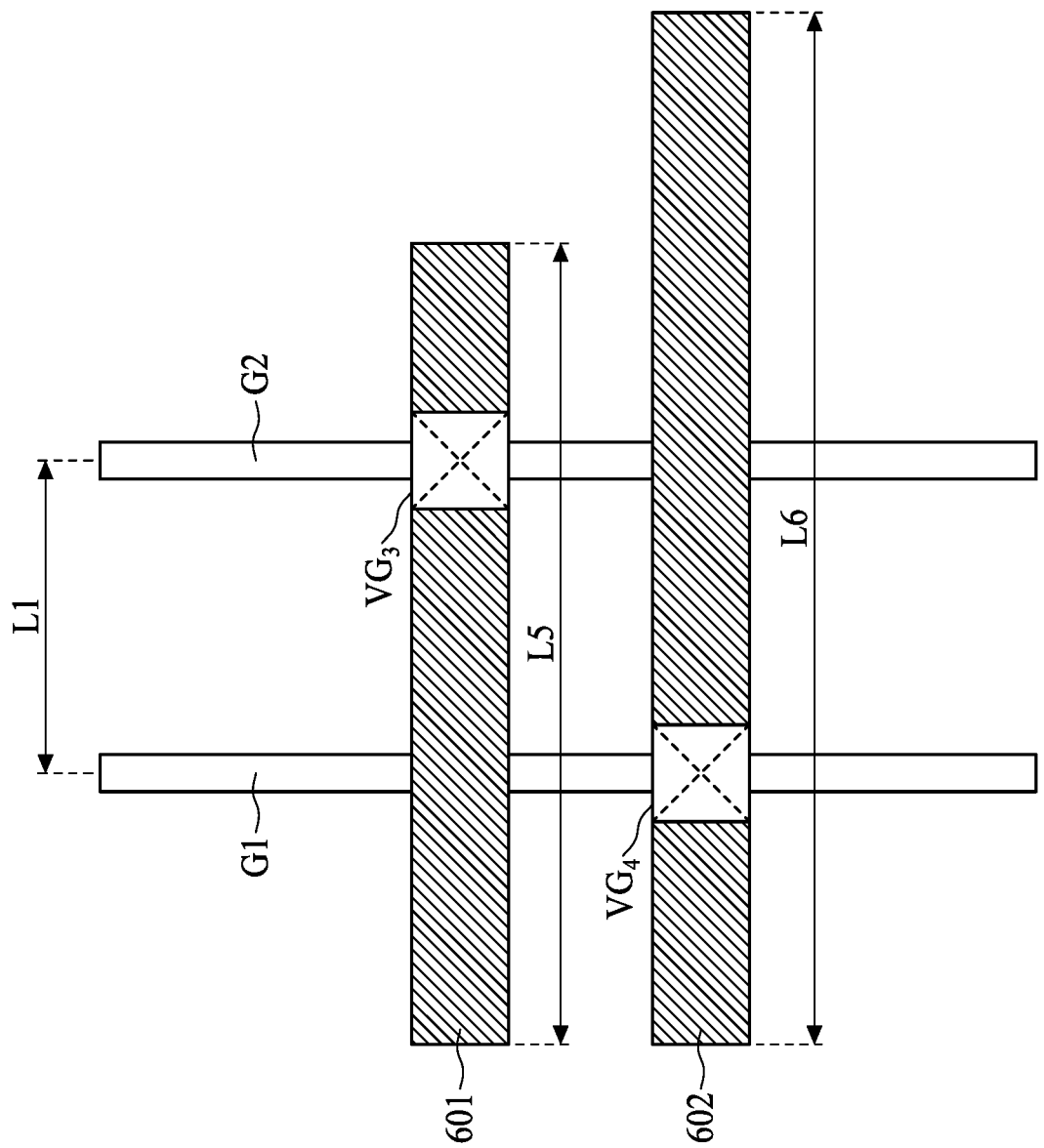

FIGS. 6A and 6B are diagrams illustrating a pattern of the gate strips, and the strips in the metal layer M0 in the semiconductor device 10 in according with another embodiment of the present disclosure. As shown in FIG. 6A, two adjacent strips 601 and 602 in the metal layer M0 are arranged in parallel, and the strips 601 and 602 cross over the gate strips G1 and G2. A length L5 of the strip 601 is smaller than two and a half times as the length L1 between two adjacent gate strips (e.g., G1 and G2). In contrary, a length L6 of the strip 602 is not smaller (i.e., greater or equal) than two and a half times as the length L1 between two adjacent gate strips (e.g., G1 and G2).

With such configurations, when each of the strips 601 and 602 is configured to receive an input signal or output an output signal, each of the strips 601 and 602 can be configured to be an access point without connecting to the upper metal layer (e.g., any strip in the metal layer M1 crossing over). In other words, each of the strips 601 and 602 is configured to be a M0 pin. When each of the strips 601 and 602 is configured to be a M0 pin, it connects to a gate strip crossing underneath via a contact via.

For example, as shown in FIG. 6A, the strip 601 connects to the gate strip G1 crossing underneath via a contact via $VG_1$ while the strip 602 connects to the gate strip G2 crossing underneath via a contact via $VG_2$. For another example, as shown in FIG. 6B, the strip 601 connects to the gate strip G2 crossing underneath via a contact via $VG_3$ while the strip 602 connects to the gate strip G1 crossing underneath via a contact via $VG_4$.

Figure 7:
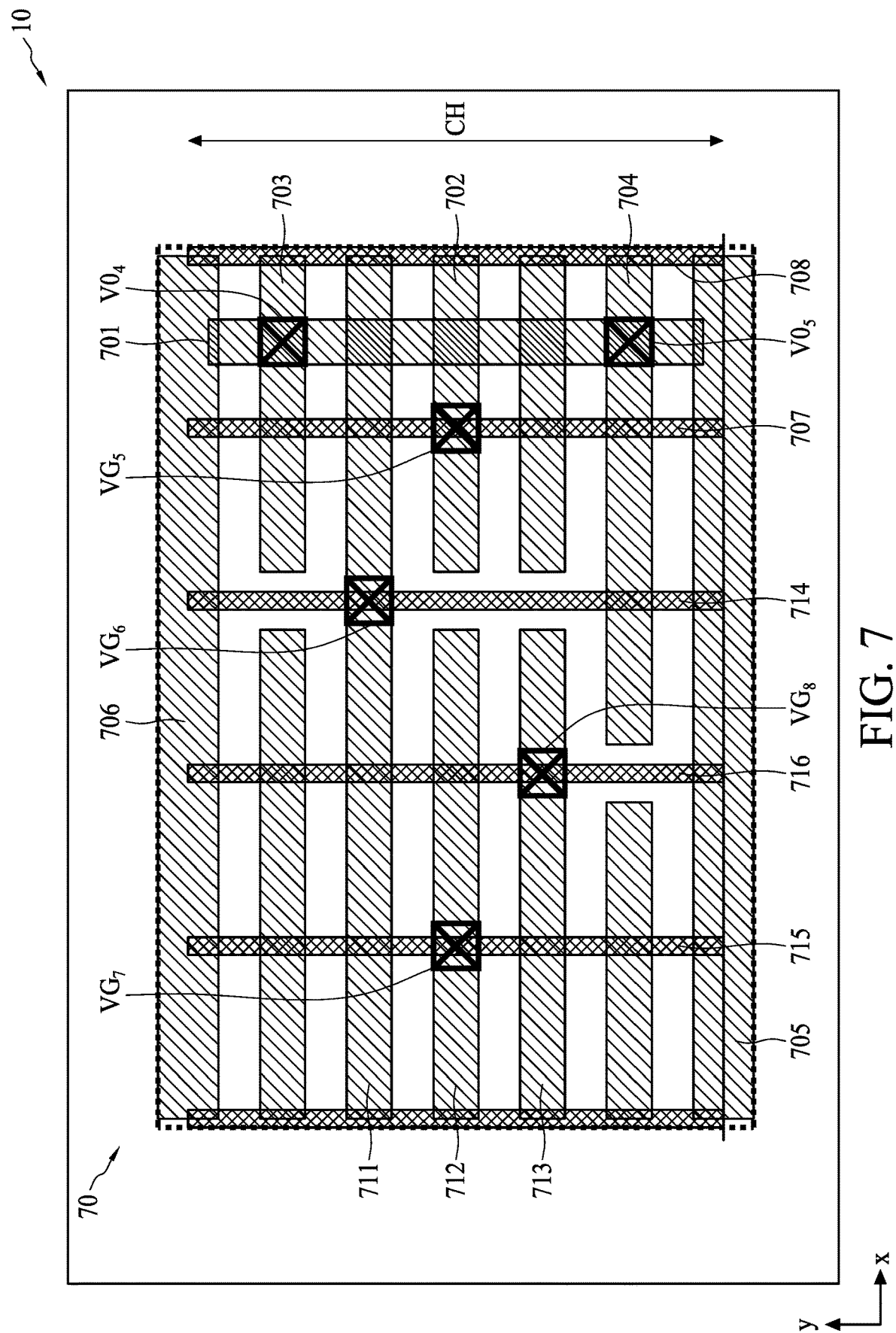
FIGS. 7 to 12 are diagrams illustrating a top view of a part of a circuit layout in a semiconductor device in accordance with an embodiment of the present disclosure.

FIG. 7 is a diagram illustrating a top view of a part of a circuit layout 70 in the semiconductor device 10 in accordance with an embodiment of the present disclosure. In this embodiment, the circuit layout 70 represents an And-Or-Inverter (AOI) logic standard cell. More specifically, circuit layout 70 is an AOI211 standard cell, wherein the AOI211 standard cell means two inputs are received by an AND gate logic while two other inputs and the output of the AND gate are received by an NOR gate logic. The circuit layout 70 is stored on a non-transitory computer-readable medium, for example, on a Taiwan Semiconductor Manufacturing Company (TSMC) cell library. When the semiconductor device 10 is designed, the circuit layout 70 is retrieved from the cell library.

The circuit layout 70 includes a plurality of gate strips, e.g., the gate strips 707 and 708, wherein each of the gate strips can be implemented by the gate strip mentioned in the embodiment of FIG. 1. Each of the gate strips extends in a first direction, for example, y-direction.

The circuit layout 70 further includes a plurality of metal strips in the metal layer M0, e.g., the strips 702, 703, 704, 705 and 706, wherein each of the metal strips extends in a second direction, for example, x direction. The circuit layout 70 further includes a metal strip 701 in the metal layer M1. The metal strip 701 extends in the first direction same as the gate strips 707 and 708.

The strip 701 in the metal layer M1 crosses over the strip 702 in the metal layer M0, and the strip 701 connects to two strips 703 and 704 in the metal layer M0 by contact vias $V0_4$ and $V0_5$, respectively. The length of the strip 702 in the metal layer M0 is smaller than two and a half times as the length between two adjacent gate strips. Following the pattern mentioned in the embodiment of FIG. 4, when the strip 702 is configured to receive an input signal or output an output signal of the AOI211 standard cell, the strip 702 is configured to be a M0 pin, and not connected to any metal strip crossing over. When the strip 702 is configured to be a M0 pin, it connects to a gate strip crossing underneath (e.g., the gate strip 707) by a contact via $VG_5$.

Except the strip 702 in the metal layer M2, the circuit layout further includes strips 711, 712, and 713 in the metal layer M2 as M0 pins. The strip 711 in the metal layer M2 connects to a gate strip 714 crossing underneath by a contact via $VG_6$, the strip 712 in the metal layer M2 connects to a gate strip 715 crossing underneath by a contact via $VG_A$, and the strip 713 in the metal layer M2 connects to a gate strip 716 crossing underneath by a contact via $VG_8$. A length between the strips 705 and 706 in the metal layer M0 is defined as a cell height CH of the circuit layout 70. In this embodiment, the cell height CH is about 60 to 150 nanometer(nm).

Figure 8:
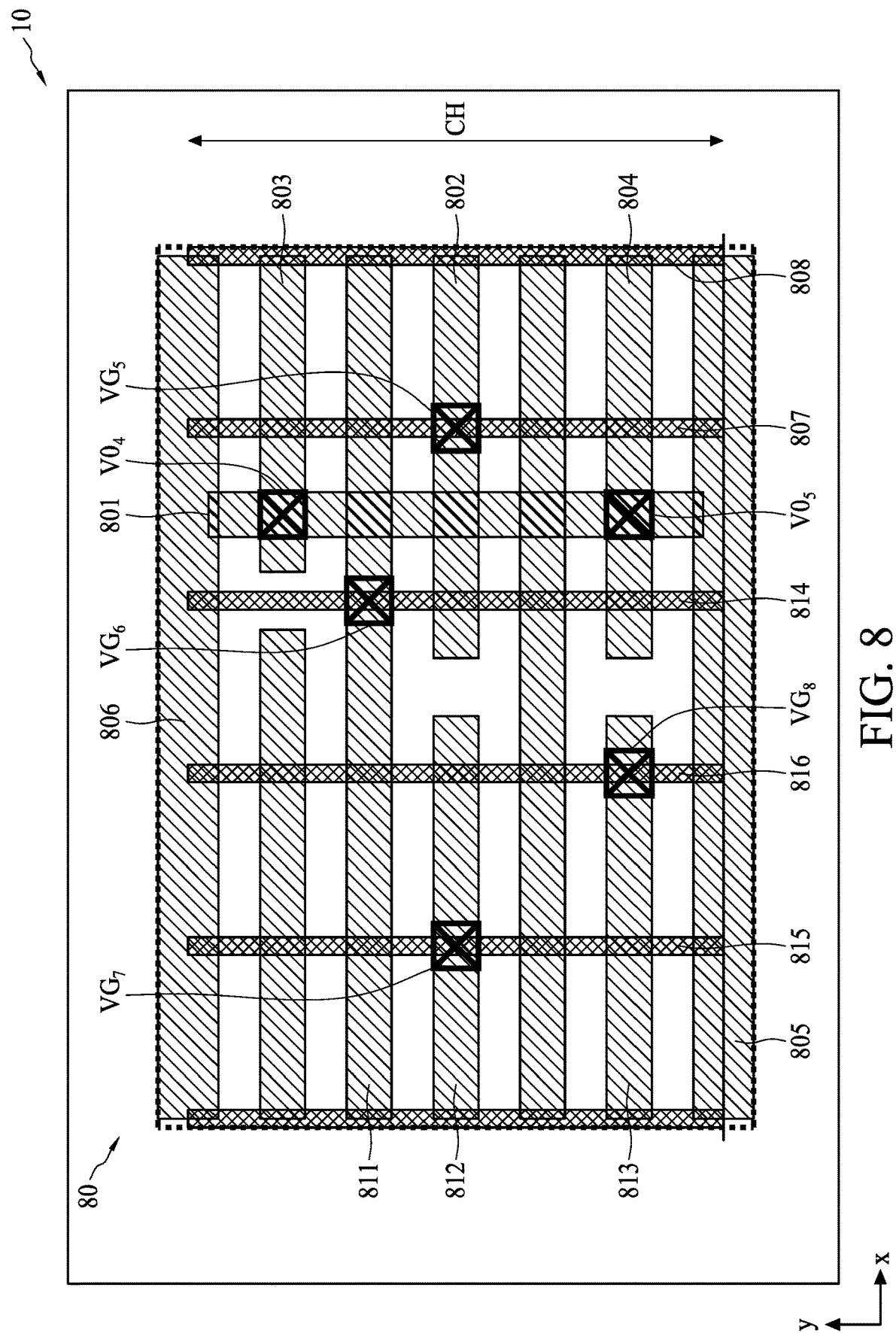

FIG. 8 is a diagram illustrating a top view of a part of a circuit layout 80 in the semiconductor device 10 in accordance with another embodiment of the present disclosure. In this embodiment, the circuit layout 80 represents another AOI211 logic standard cell. The circuit layout 80 is stored on a non-transitory computer-readable medium, for example, on a TSMC cell library. When the semiconductor device 10 is designed, the circuit layout 80 is retrieved from the cell library.

The circuit layout 80 includes a plurality of gate strips, e.g., the gate strips 807 and 808, wherein each of the gate strips can be implemented by the gate strip mentioned in the embodiment of FIG. 1. Each of the gate strips extends in a first direction, for example, y-direction.

The circuit layout 80 further includes a plurality of metal strips in the metal layer M0, e.g., the strips 802, 803, 804, 805 and 806, wherein each of the metal strips extends in a second direction, for example, x direction. The circuit layout 80 further includes a metal strip 801 in the metal layer M1. The metal strip 801 extends in the first direction same as the gate strips 807 and 808.

The strip 801 in the metal layer M1 crosses over the strip 802 in the metal layer M0, and the strip 801 connects to two strips 803 and 804 in the metal layer M0 by contact vias $V0_4$ and $V0_5$, respectively. The length of the strip 802 in the metal layer M0 is smaller than two and a half times as the length between two adjacent gate strips. Following the pattern mentioned in the embodiment of FIG. 4, when the strip 802 is configured to receive an input signal or output an output signal of the AOI211 standard cell, the strip 802 is configured to be a M0 pin, and not connected to any metal strip crossing over. When the strip 802 is configured to be a M0 pin, it connects to a gate strip crossing underneath (e.g., the gate strip 807) by a contact via $VG_5$.

Except the strip 802 in the metal layer M2, the circuit layout further includes strips 811, 812, and 813 in the metal layer M2 as M0 pins. The strip 811 in the metal layer M2 connects to a gate strip 814 crossing underneath by a contact via $VG_6$, the strip 812 in the metal layer M2 connects to a gate strip 815 crossing underneath by a contact via $VG_4$, and the strip 813 in the metal layer M2 connects to a gate strip 816 crossing underneath by a contact via $VG_8$. A length between the strips 805 and 806 in the metal layer M0 is defined as a cell height CH of the circuit layout 80. In this embodiment, the cell height CH is about 60 to 150 nanometer(nm).

Figure 9:
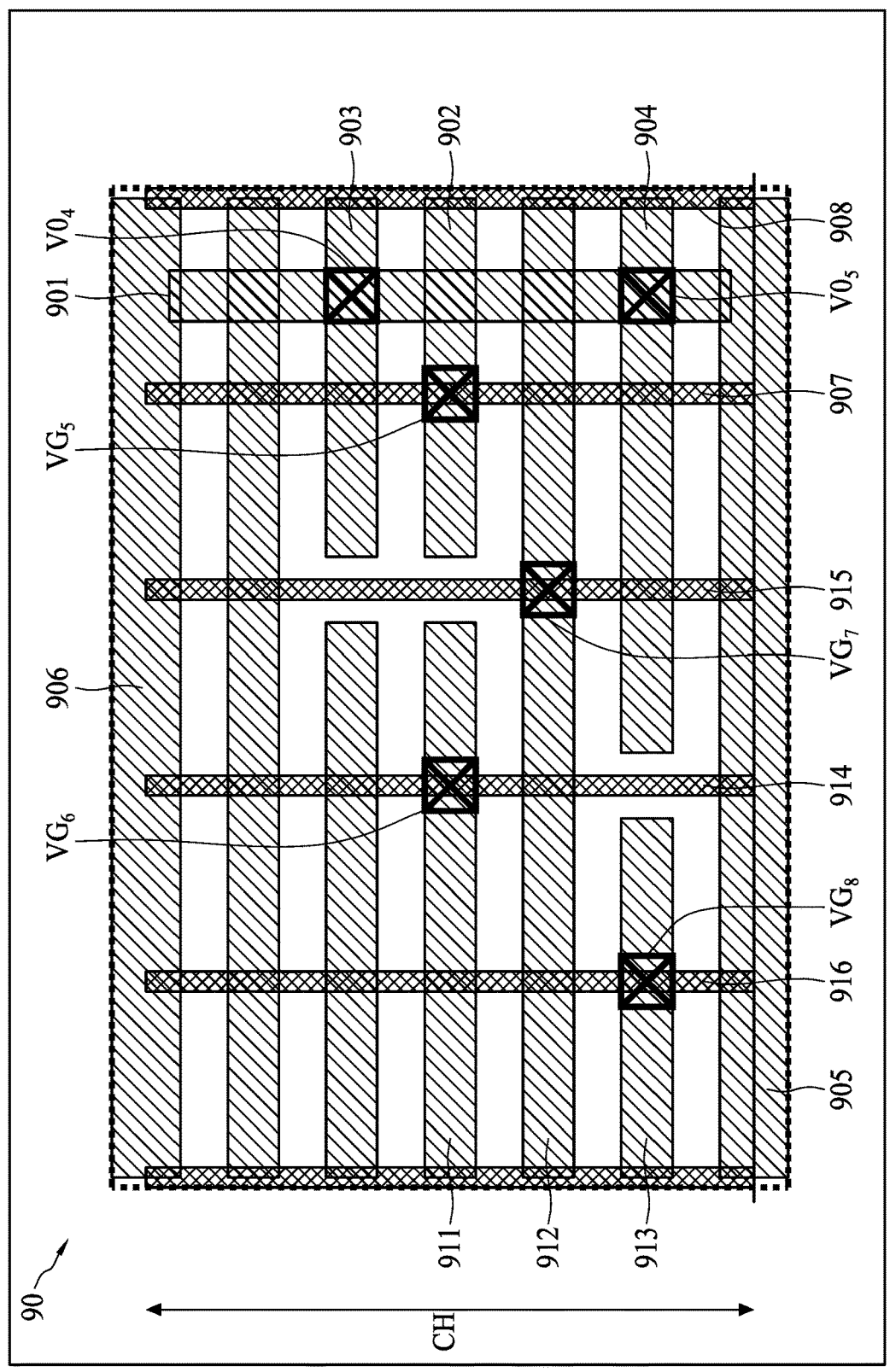

FIG. 9 is a diagram illustrating a top view of a part of a circuit layout 90 in the semiconductor device 10 in accordance with another embodiment of the present disclosure. In this embodiment, the circuit layout 90 represents an AOI22 logic standard cell, wherein the AOI22 standard cell means two inputs are received by an AND gate logic while two other inputs are received by another AND gate, and the outputs of both AND gates are received by an NOR gate logic. The circuit layout 90 is stored on a non-transitory computer-readable medium, for example, on a TSMC cell library. When the semiconductor device 10 is designed, the circuit layout 90 is retrieved from the cell library.

The circuit layout 90 includes a plurality of gate strips, e.g., the gate strips 907 and 908, wherein each of the gate strips can be implemented by the gate strip mentioned in the embodiment of FIG. 1. Each of the gate strips extends in a first direction, for example, y-direction.

The circuit layout 90 further includes a plurality of metal strips in the metal layer M0, e.g., the strips 902, 903, 904, 905 and 906 wherein each of the metal strips extends in a second direction, for example, x direction. The circuit layout 90 further includes a metal strip 901 in the metal layer M1. The metal strip 901 extends in the first direction same as the gate strips 907 and 908.

The strip 901 in the metal layer M1 crosses over the strip 902 in the metal layer M0, and connects to two strips 903 and 904 in the metal layer M0 by contact vias $V0_4$ and $V0_5$, respectively. The length of the strip 902 in the metal layer M0 is smaller than two and a half times as the length between two adjacent gate strips. Following the pattern mentioned in the embodiment of FIG. 4, when the strip 902 is configured to receive an input signal or output an output signal of the AOI22 standard cell, the strip 902 is configured to be a M0 pin, and not connected to any metal strip crossing over. When the strip 902 is configured to be a M0 pin, it connects to a gate strip crossing underneath (e.g., the gate strip 907) by a contact via $VG_5$.

Except the strip 902 in the metal layer M2, the circuit layout further includes strips 911, 912, and 913 in the metal layer M2 as M0 pins. The strip 911 in the metal layer M2 connects to a gate strip 914 crossing underneath by a contact via $VG_6$, the strip 912 in the metal layer M2 connects to a gate strip 915 crossing underneath by a contact via $VG_4$, and the strip 913 in the metal layer M2 connects to a gate strip 916 crossing underneath by a contact via $VG_8$. A length between the strips 905 and 906 in the metal layer M0 is defined as a cell height CH of the circuit layout 90. In this embodiment, the cell height CH is about 60 to 150 nanometer(nm).

Figure 10:
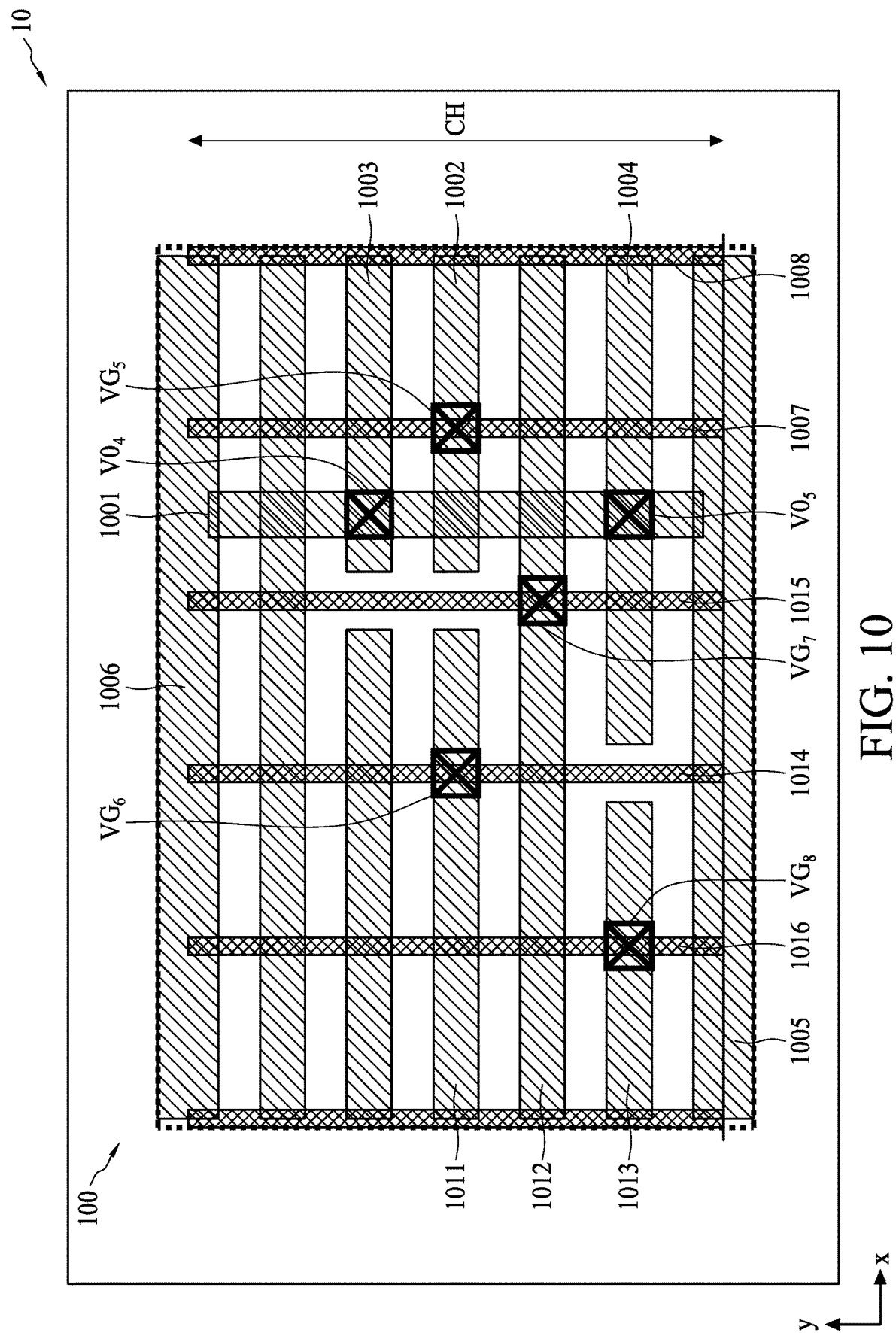

FIG. 10 is a diagram illustrating a top view of a part of a circuit layout 100 in the semiconductor device 10 in accordance with another embodiment of the present disclosure. In this embodiment, the circuit layout 100 represents another AOI22 logic standard cell. The circuit layout 100 is stored on a non-transitory computer-readable medium, for example, on a TSMC cell library. When the semiconductor device 10 is designed, the circuit layout 100 is retrieved from the cell library.

The circuit layout 100 includes a plurality of gate strips, e.g., the gate strips 1007 and 1008, wherein each of the gate strips can be implemented by the gate strip mentioned in the embodiment of FIG. 1. Each of the gate strips extends in a first direction, for example, y-direction.

The circuit layout 100 further includes a plurality of metal strips in the metal layer M0, e.g., the strips 1002, 1003, 1004, 1005 and 1006 wherein each of the metal strips extends in a second direction, for example, x direction. The circuit layout 100 further includes a metal strip 1001 in the metal layer M1. The metal strip 1001 extends in the first direction same as the gate strips 1007 and 1008.

The strip 1001 in the metal layer M1 crosses over the strip 1002 in the metal layer M0, and connects to two strips 1003 and 1004 in the metal layer M0 by contact vias $V0_4$ and $V0_5$, respectively. The length of the strip 1002 in the metal layer M0 is smaller than two and a half times as the length between two adjacent gate strips. Following the pattern mentioned in the embodiment of FIG. 4, when the strip 1002 is configured to receive an input signal or output an output signal of the AOI22 standard cell, the strip 1002 is configured to be a M0 pin, and not connected to any metal strip crossing over. When the strip 1002 is configured to be a M0 pin, it connects to a gate strip crossing underneath (e.g., the gate strip 1007) by a contact via $VG_5$.

Except the strip 1002 in the metal layer M2, the circuit layout further includes strips 1011, 1012, and 1013 in the metal layer M2 as M0 pins. The strip 1011 in the metal layer M2 connects to a gate strip 1014 crossing underneath by a contact via $VG_6$, the strip 1012 in the metal layer M2 connects to a gate strip 1015 crossing underneath by a contact via $VG_4$, and the strip 1013 in the metal layer M2 connects to a gate strip 1016 crossing underneath by a contact via $VG_8$. A length between the strips 1005 and 1006 in the metal layer M0 is defined as a cell height CH of the circuit layout 100. In this embodiment, the cell height CH is about 60 to 150 nanometer(nm).

Figure 11:
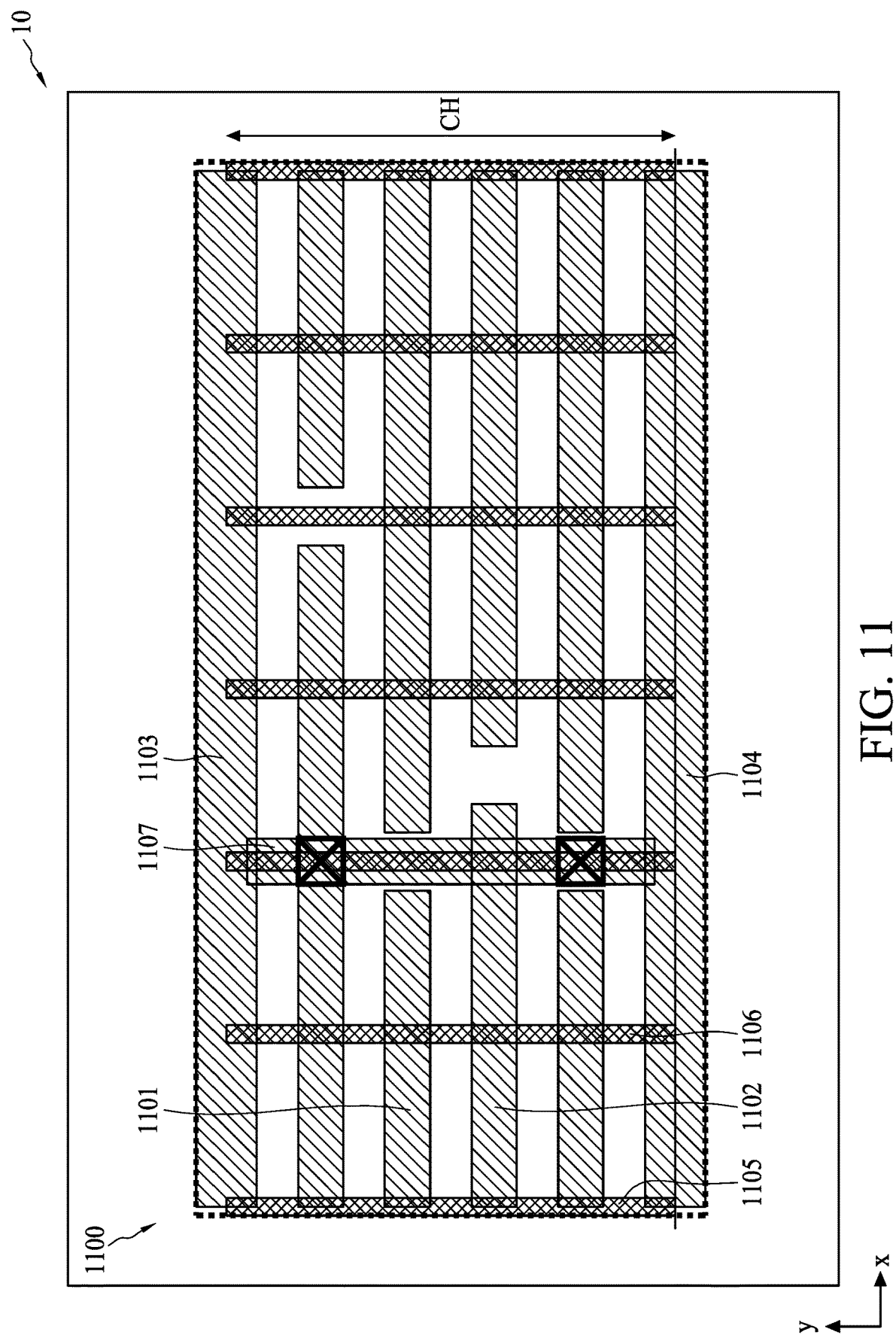

FIG. 11 is a diagram illustrating a top view of a part of a circuit layout 1100 in the semiconductor device 10 in accordance with another embodiment of the present disclosure. The circuit layout 1100 includes a plurality of gate strips, e.g., the gate strips 1105 and 1106, wherein each of the gate strips can be implemented by the gate strip mentioned in the embodiment of FIG. 1. Each of the gate strips extends in a first direction, for example, y-direction. The circuit layout can be an AN4D1 standard cell stored on a non-transitory computer-readable medium, for example, on a TSMC cell library. When the semiconductor device 10 is designed, the circuit layout 1100 is retrieved from the cell library.

The circuit layout 1100 further includes a plurality of metal strips in the metal layer M0, e.g., the strips 1101, 1102, 1103, and 1104, wherein each of the metal strips extends in a second direction, for example, x direction. The circuit layout 1100 further includes a metal strip 1107 in the metal layer M1. The metal strip 1107 extends in the first direction same as the gate strips 1105 and 1106.

The adjacent strips 1101 and 1102 in the metal layer M0 are arranged in parallel, wherein the length of both the strips 1101 and 1102 are smaller than two and a half times as the length between two adjacent gate strips. Following the pattern mentioned in the embodiment of FIG. 5, when each of the strips 1101 and 1102 is configured to receive an input signal or output an output signal of the circuit layout 1100, each of the strips 1101 and 1102 is configured to be a M0 pin, and not connected to any metal strip crossing over. When each of the strips 1101 and 1102 is configured to be a M0 pin, it connects to a gate strip crossing underneath. A length between the strips 1103 and 1104 in the metal layer M0 is defined as a cell height CH of the circuit layout 1100. In this embodiment, the cell height CH is about 60 to 150 nanometer(nm).

Figure 12:
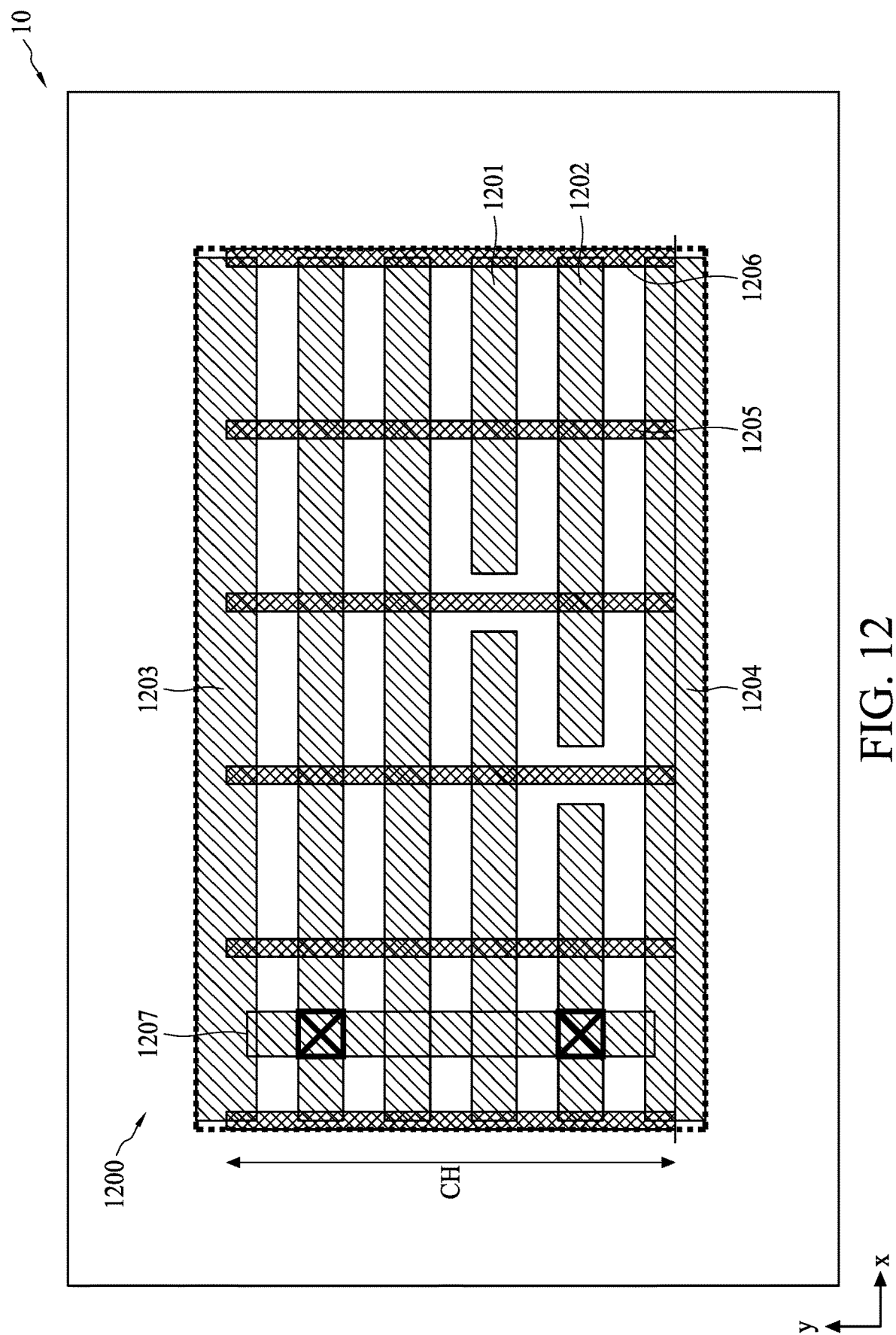

FIG. 12 is a diagram illustrating a top view of a part of a circuit layout 1200 in the semiconductor device 10 in accordance with another embodiment of the present disclosure. The circuit layout 1200 includes a plurality of gate strips, e.g., the gate strips 1205 and 1206, wherein each of the gate strips can be implemented by the gate strip mentioned in the embodiment of FIG. 1. Each of the gate strips extends in a first direction, for example, y-direction. The circuit layout can be an ND4D1 standard cell stored on a non-transitory computer-readable medium, for example, on a TSMC cell library. When the semiconductor device 10 is designed, the circuit layout 1200 is retrieved from the cell library.

The circuit layout 1200 further includes a plurality of metal strips in the metal layer M0, e.g., the strips 1201, 1202, 1203, and 1204, wherein each of the metal strips extends in a second direction, for example, x direction. The circuit layout 1200 further includes a metal strip 1207 in the metal layer M1. The metal strip 1207 extends in the first direction same as the gate strips 1205 and 1206.

The adjacent strips 1201 and 1202 in the metal layer M0 are arranged in parallel. The length of the strip 1201 is smaller than two and a half times as the length between two adjacent gate strips, while the length of the strips 1202 is greater than two and a half times as the length between two adjacent gate strips. Following the pattern mentioned in the embodiment of FIG. 6, when each of the strips 1201 and 1202 is configured to receive an input signal or output an output signal of the circuit layout 1200, each of the strips 1201 and 1202 is configured to be a M0 pin, and not connected to any metal strip crossing over. When each of the strips 1201 and 1202 is configured to be a M0 pin, it connects to a gate strip crossing underneath. A length between the strips 1203 and 1204 in the metal layer M0 is defined as a cell height CH of the circuit layout 1200. In this embodiment, the cell height CH is about 60 to 150 nanometer(nm).

Figure 13:
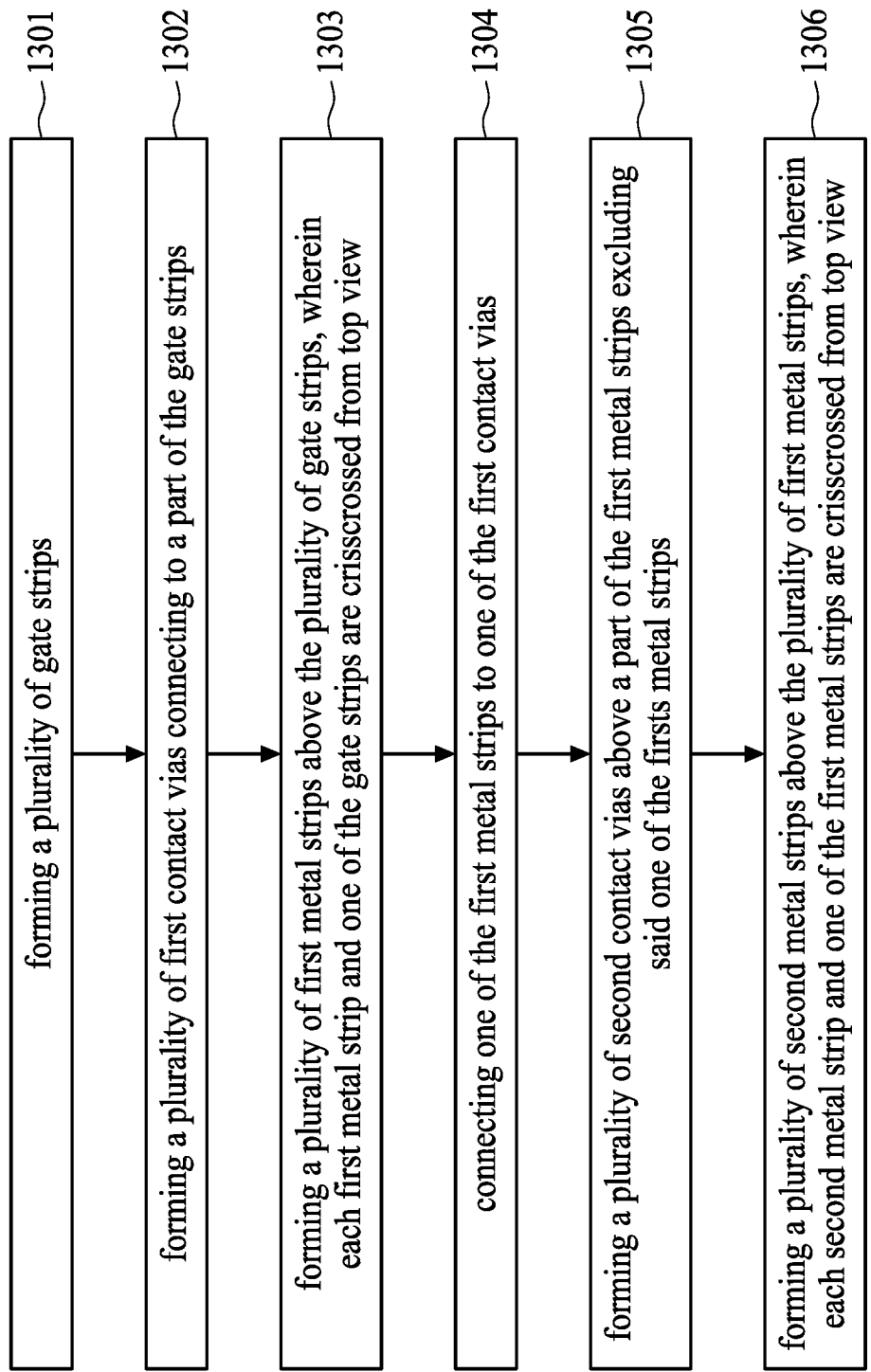
FIG. 13 is a flowchart illustrating a method of manufacturing a semiconductor device in accordance with an embodiment of the present disclosure.

FIG. 13 is a flowchart illustrating a method 1300 of manufacturing a semiconductor device in accordance with an embodiment of the present disclosure. Provided that the results are substantially the same, the steps shown in FIG. 13 are not required to be executed in the exact order. The method 1300 is summarized as follow.

Step 1301: a plurality of gate strips are formed.

Step 1302: a plurality of first contact vias connecting to a part of the gate strips are formed.

Step 1303: a plurality of first metal strips are formed above the plurality of gate strips, wherein each first metal strip and one of the gate strips are crisscrossed from top view.

Step 1304: one of the first metal strips is connected to one of the first contact vias.

Step 1305: a plurality of second contact vias are formed above a part of the first metal strips excluding said one of the first metal strips.

Step 1306: a plurality of second metal strips are formed above the plurality of first metal strips, wherein each second metal strip and one of the first metal strips are crisscrossed from top view.

Those skilled in the art should readily understand the detail of the method 1300 after reading the embodiments of FIG. 1 to FIG. 12. The detailed description is omitted here for brevity.

Figure 14:
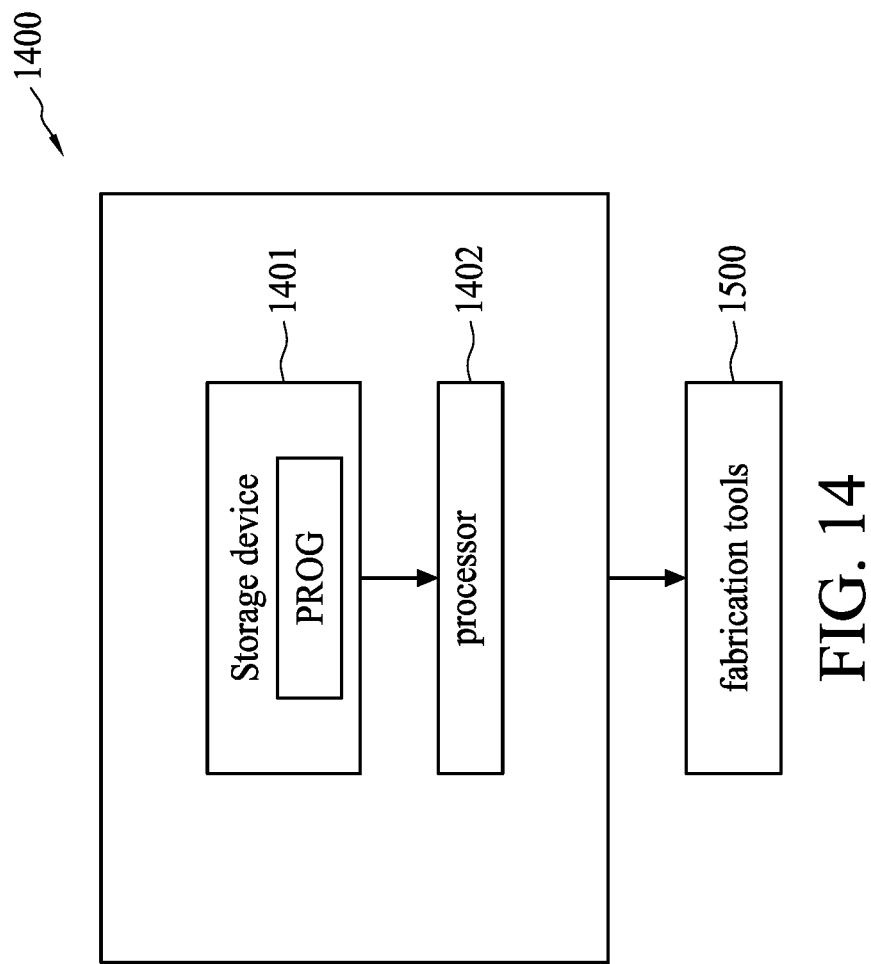
FIG. 14 is a diagram illustrating a system according to an embodiment of the present disclosure.

FIG. 14 is a diagram illustrating a system 1400 according to an embodiment of the present disclosure. The system 1400 includes a storage device 1401, e.g., a memory, and a processor 1402. The storage device 1401 is arranged to store a program code PROG. When the program code PROG is executed by the processor 1402, the system 1400 execute the layout implementation mentioned in the embodiments of FIGS. 1 to 12, and controls the fabrication tools 1500 to physical implementation to fabricate the layouts. Those skilled in the art should readily understand the operation of the fabrication tools 1500 after reading the embodiments of FIG. 1 to FIG. 13. The detailed description is omitted here for brevity.

In some embodiments, a semiconductor device is disclosed. The semiconductor device includes a plurality of gate strips, a plurality of first metal strips and a plurality of second metal strips. Each gate strip is arranged to be a gate terminal of a transistor. The plurality of first metal strips are formed above the plurality of gate strips, wherein the plurality of first metal strips are co-planar, and each first metal strip and one of the gate strips are crisscrossed from top view. The plurality of second metal strips are formed above the first metal strips, wherein the plurality of second metal strips are co-planar, and each second metal strip and one of the first metal strips are crisscrossed from top view. One of the first metal strips connects to one of gate strips crossing underneath by a first contact via without connecting to one of second metal strips crossing over. A length between two adjacent gate strips is twice as a length between two adjacent second metal strips, and a length of said one of the first metal strips is smaller than two and a half times as the length between two adjacent gate strips.

In some embodiments, a method of manufacturing a semiconductor device is disclosed. The method includes: forming a plurality of gate strips, wherein each gate strip is arranged to be a gate terminal of a transistor; forming a plurality of first contact vias connecting to a part of the gate strips; forming a plurality of first metal strips above the plurality of gate strips, wherein the plurality of first metal strips are co-planar, and each first metal strip and one of the gate strips are crisscrossed from top view; connecting one of the first metal strips to one of the first contact vias; forming a plurality of second contact vias above a part of the first metal strips excluding said one of the first metal strips; forming a plurality of second metal strips above the plurality of first metal strips, wherein the plurality of second metal strips are co-planar, and each second metal strip and one of the first metal strips are crisscrossed from top view; fabricating masks for manufacturing the semiconductor device; and manufacturing the semiconductor device based on the fabricated masks; wherein a length between two adjacent gate strips is twice as a length between two adjacent second metal strips, and a length of said one of the first metal strips is smaller than two and a half times as the length between two adjacent gate strips.

In some embodiments, a layout of an integrated circuit (IC) is disclosed. The layout is stored on a non-transitory computer-readable medium, and includes: a plurality of gate strips, a plurality of first metal strips and a plurality of first metal strips. Each gate strip is arranged to be a gate terminal of a transistor. The plurality of first metal strips are formed above the plurality of gate strips, wherein the plurality of first metal strips are co-planar, and each first metal strip and one of the gate strips are crisscrossed from top view. The plurality of second metal strips are formed above the first metal strips, wherein the plurality of second metal strips are co-planar, and each second metal strip and one of the first metal strips are crisscrossed from top view. One of the first metal strips connects to one of gate strips crossing underneath by a first contact via without connecting to one of second metal strips crossing over. A length between two adjacent gate strips is twice as a length between two adjacent second metal strips, and a length of said one of the first metal strips is smaller than two and a half times as the length between two adjacent gate strips.

What is claimed is:

1. A semiconductor device, comprising:
   a plurality of gate strips, wherein each gate strip is arranged to be a gate terminal of a transistor;
   a plurality of first metal strips, formed above the plurality of gate strips, wherein the plurality of first metal strips are co-planar, and each first metal strip and one of the gate strips are crisscrossed from top view; and
   a plurality of second metal strips, formed above the first metal strips, wherein the plurality of second metal strips are co-planar, and each second metal strip and one of the first metal strips are crisscrossed from top view;
   wherein one of the first metal strips connects to one of gate strips crossing underneath by a first contact via without connecting to one of second metal strips crossing over;
   wherein a length between two adjacent gate strips is twice as a length between two adjacent second metal strips, and a length of said one of the first metal strips is smaller than two and a half times as the length between two adjacent gate strips.

2. The semiconductor device of claim 1, wherein one of the second metal strips connects to two first metal strips by respective a second contact via and a third contact via, and said two first metal strips exclude said one of the first metal strips; wherein said one of the second metal strips crosses said one of the first metal strips from top view.

3. The semiconductor device of claim 1, wherein another one of the first metal strips connects to another one of the gate strips via a second contact via without connecting to one of the second metal strips crossing over.

4. The semiconductor device of claim 3, wherein said another one of the first metal strips is next to said one of the first metal strips.

5. The semiconductor device of claim 4, wherein a length of said another one of the first metal strip is smaller than two and a half times as the length between two adjacent gate strips.

6. The semiconductor device of claim 1, wherein two of the first metal strips receive respective a first reference voltage and a second reference voltage, four other first metal strips are arranged between said two of the first metal strips in parallel.

7. The semiconductor device of claim 6, wherein a length between said two of the first metal strips ranges from about 60 to 150 nanometer(nm).

8. A layout of an integrated circuit (IC), wherein the layout is stored on a non-transitory computer-readable medium, comprising:
   a plurality of gate strips, wherein each gate strip is arranged to be a gate terminal of a transistor;
   a plurality of first metal strips, formed above the plurality of gate strips, wherein each first metal strip and one of the gate strips are crisscrossed from top view; and
   a plurality of second metal strips, formed above the first metal strips, wherein each second metal strip and one of the first metal strips are crisscrossed from top view;
   wherein one of the first metal strips connects to one of gate strips crossing underneath by a first contact via without connecting to one of second metal strips crossing over;
   wherein a length between two adjacent gate strips is twice as a length between two adjacent second metal strips, and a length of said one of the first metal strips is smaller than two and a half times as the length between two adjacent gate strips.

9. The layout of claim 8, wherein one of the second metal strips connects to two first metal strips by respective a second contact via and a third contact via, and said two first metal strips exclude said one of the first metal strips; wherein said one of the second metal strips crosses said one of the first metal strips from top view.

10. The layout of claim 8, wherein another one of the first metal strips connects to another one of the gate strips via a second contact via without connecting to one of the second metal strips crossing over.

11. The layout of claim 10, wherein said another one of the first metal strips is next to said one of the first metal strips.

12. The layout of claim 11, wherein a length of said another one of the first metal strip is smaller than two and a half times as the length between two adjacent gate strips.

13. The layout of claim 12, wherein two of the first metal strips receive respective a first reference voltage and a second reference voltage, four other first metal strips are arranged between said two of the first metal strips in parallel.

14. The layout of claim 13, wherein a length between said two of the first metal strips ranges from about 60 to 150 nanometer(nm).

15. A layout of an integrated circuit (IC), wherein the layout is stored on a non-transitory computer-readable medium, comprising:
   a first patterned layer, including a plurality of gate strips equally disposed and extending in a first direction, wherein every two immediately adjacent gate strip are distanced from a first length;
   a first conductive layer above the first patterned layer, including:
      a first conductive pattern, extending in a second direction and including a first row and a second row crossing over the plurality of gate strips;
      a second conductive pattern, extending in the second direction and disposed between the first row and the second row, wherein the second conductive pattern connects to one of the plurality of gate strips; and
   a second conductive layer above the first conductive layer, including a plurality of conductive strips equally disposed and extending in the first direction, wherein every two immediately adjacent conductive strip are distanced from a second length, and the first length is twice as the second length;
   wherein the second conductive pattern is free from connecting to the second conductive layer, and a length of the second conductive pattern in the second direction is smaller than two and a half times as the first length.

16. The layout of claim 15, wherein the second conductive pattern includes a first conductive strip and a second conductive strip immediately adjacent to the first conductive strip, and the first conductive strip is connected to one of the gate strips and the second conductive strip is connected to another one of the gate strips.

17. The layout of claim 16, wherein one of the plurality of conductive strips in the second conductive layer crosses over the first conductive strip from a top view and is free from crossing over the second conductive strip from the top view.

18. The layout of claim 17, wherein the first conductive layer further includes a third conductive pattern disposed between the first row and the second conductive pattern, and said one of the plurality of conductive strips is connected to the third conductive pattern.

19. The layout of claim 15, wherein the first row and the second row receive respective a first reference voltage and a second reference voltage.

20. The layout of claim 15, wherein a length between the first row and the second row ranges from about 60 to 150 nanometer(nm).

* * * * *